(12) United States Patent
Kawasaki et al.

(10) Patent No.: US 7,080,258 B2
(45) Date of Patent: Jul. 18, 2006

(54) IC, IC-MOUNTED ELECTRONIC DEVICE, DEBUGGING METHOD AND IC DEBUGGER

(75) Inventors: Yusuke Kawasaki, Kawasaki (JP); Shigeru Hashimoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 643 days.

(21) Appl. No.: 09/784,151

(22) Filed: Feb. 16, 2001

(65) Prior Publication Data

US 2002/0010856 A1  Jan. 24, 2002

(30) Foreign Application Priority Data

Jun. 30, 2000  (JP)  .............................. 2000-199266

(51) Int. Cl.
  *G06F 11/30* (2006.01)
  *G06F 12/14* (2006.01)
  *G06F 9/44* (2006.01)
  *H04L 9/32* (2006.01)

(52) U.S. Cl. ...................... 713/189; 713/187; 717/124; 726/34

(58) Field of Classification Search ................ 713/168, 713/187, 189, 200; 717/124; 726/34, 26, 726/27, 29
See application file for complete search history.

(56) References Cited

U.S. PATENT DOCUMENTS

| 4,908,038 | A | * | 3/1990 | Matsumura et al. ........ 235/380 |
| 5,704,039 | A | * | 12/1997 | Yishay et al. ................ 713/200 |
| 5,784,464 | A | * | 7/1998 | Akiyama et al. ........... 713/155 |
| 5,978,937 | A |   | 11/1999 | Miyamori et al. |
| 6,073,176 | A | * | 6/2000 | Baindur et al. ............. 709/227 |
| 6,374,354 | B1 | * | 4/2002 | Walmsley et al. .......... 713/167 |
| 6,622,184 | B1 | * | 9/2003 | Tabe et al. .................... 710/36 |
| 6,757,829 | B1 | * | 6/2004 | Laczko et al. .............. 713/187 |
| 6,769,065 | B1 | * | 7/2004 | Mayer .......................... 726/2 |

FOREIGN PATENT DOCUMENTS

| EP | 0 720 093 | 7/1996 |
| EP | 1168181 A2 * | 1/2002 |

* cited by examiner

*Primary Examiner*—Emmanuel L. Moise
*Assistant Examiner*—Zachary A. Davis
(74) *Attorney, Agent, or Firm*—Arent Fox PLLC

(57) ABSTRACT

Authentication circuits are provided between a debug I/F circuit and a debug terminal. The authentication circuit transmits a transmission key externally at the time of activation, and authenticates based on a reception signal and the transmission key, and enables access to the debug I/F. Thus, it is possible to prevent a spurious access from the debug I/F by a third person by the authentication circuit.

17 Claims, 9 Drawing Sheets

IC, IC-MOUNTED ELECTRONIC DEVICE, DEBUGGING METHOD AND IC DEBUGGER

BACKGROUND OF THE INVENTION

1. Field of the Invention

The present invention relates to an IC, an electronic device, a method for debugging the IC, a method for debugging the electronic device, and a debugger, having a security function for preventing a spurious acquisition of a behavior of an internal circuit of the IC.

2. Description of the Related Arts

In every field such as an electronic commerce, etc., a device of higher security is demanded. For this reason, various methods for preventing a reverse engineering in the device are devised. However, irrespective of these trials, a reverse engineering ROM, or the like is prepared, and an abuse for a reluctant use for a developer of the device does not become extinct. For this reason, a system in which a third person is incapable of engineering operation itself of the device is demanded.

FIG. 9 is an explanatory diagram of the prior art. As shown in FIG. 9, an LSI 110 is provided with a CPU 200, a peripheral circuit 300, and a bus 600 for connecting therewith. In this LSI 110, the CPU 200 acquires data or programs from the peripheral circuit 300, and processes the data, and outputs them to the peripheral circuit 300.

On the other hand, in the case where the device is developed by use of this LSI 110, a processing behavior of the CPU 200 is directly monitored, and the programs or the like are verified. A verification method for monitoring output data of the peripheral circuit 300 is executed, but a behavior of the CPU 200 up to the output cannot be elucidated from the output data.

For this reason, the CPU 200 is provided with a debug I/F (interface) circuit 400 via another bus 500. An external debug controller 100 of the LSI 110 is connected to the debug I/F 400, and supplies a clock CLK, and inputs a signal SIN, and obtains an output SOUT.

This debug I/F circuit 400 is exploited for acquiring a behavior (contents of a program counter, a register, or the like) of the CPU 200 at the time of developing the device, and in the case where the device is shipped to a field, the debug I/F circuit 400 is similarly exploited at the time of the occurrence of a fault, and at the time of diagnosing the device.

A security function is not provided in the prior art with respect to an access from the debug I/F 400, as described above.

In the device which does not require a conventional normal security, a debug I/F terminal is seen from outside irrespective of the time of being unused/the time of being used, and is entirely defenseless for the exploitation by the third person. For this reason, in the case of the device shipped to the field, the third person uses the debug I/F terminal, so that a behavior of a central processing unit (CPU) can accurately and readily be made reverse engineering, and it needs high-performance in security.

However, in the case where the conventional device uses the CPU provided with the debug I/F function, a clue of analysis is given to the third person. For example, in the case of a POS register using the CPU with the debug I/F function, a debug unit of the debug I/F is connected to a personal computer, etc., so that even data such as a password, a cryptographic key, or the like can readily be searched.

SUMMARY OF THE INVENTION

It is therefore the object of the present invention to provide an IC, an electronic device, a debug method, and a debugger for restricting a use of a debug I/F and preventing a spurious reverse engineering by a third person.

It is another object of the present invention to provide an IC, an electronic device, a debug method, and a debugger in which an authentication logic is provided between the debug I/F circuit in the LSI and an external terminal, and a restriction is formed in exploiting the debug I/F.

It is yet another object of the present invention to provide an IC, an electronic device, a debug method, and a debugger for preventing the engineering of the authentication logic between the debug I/F circuit in the LSI and the external terminal.

It is a further object of the present invention to provide an IC, an electronic device, a debug method, and a debugger for detecting the spurious reverse engineering by a third person which restricts the use of the debug I/F.

In order to attain the above objects, according to a first aspect of the present invention there is provided an IC comprising an internal circuit; a debug I/F circuit for debugging the internal circuit from externally; and an authentication circuit which is provided between the debug I/F circuit and a debug terminal, and when the debug I/F circuit is activated, transmits a transmission key from the debug terminal to outside, and authenticates from a signal received from the debug terminal and a transmission key, and enables operation of the debug I/F circuit.

According to a second aspect of the present invention there is provided an electronic device mounting with an IC, the IC comprising an internal circuit; a debug I/F circuit for debugging the internal circuit from externally; and an authentication circuit which is provided between the debug I/F circuit and the debug terminal, and when the debug I/F circuit is activated, transmits the transmission key from the debug terminal to outside, and collates the signal received from the debug terminal with the transmission key, and enables operation of the debug I/F circuit.

According to a third aspect of the present invention there is provided a debugging method comprising the steps of transmitting the a transmission key to exterally when the debug I/F circuit is activated; and authenticating from a reception signal received externally and the transmission key to enable operation of the debug I/F circuit.

According to a fourth aspect of the present invention there is provided a debugger for debugging an IC, the IC comprising an internal circuit; a debug I/F circuit for externally debugging the internal circuit; and an authentication circuit which is provided between the debug I/F circuit and the debug terminal, and when the debug I/F circuit is activated, transmits the transmission key from the debug terminal to outside, and collates the signal received from the debug terminal with the transmission key, and enables operation of the debug I/F circuit, further comprising: the discrimination device which is provided between a debug unit and the debug I/F circuit, and receives the transmission key to encode it by a predetermined key, and transmits the reception signal.

Since an authentication circuit is provided between the debug I/F circuit and the debug terminal, it is possible to protect an internal circuit from a dishonesty as performing reverse engineering a motion of the internal circuit, etc. by exploiting the debug I/F of the third person, and to hold security higher than a conventional device.

Furthermore, since the security is performed by a physical connection and an authentication algorithm by a set of a discrimination device and an IC, the high security is enabled. Furthermore, a spurious engineering by a PC (personal computer) is difficult.

Furthermore, in the debugging method according to the present invention, the authentication step has a step of canceling a reset signal to the debug I/F circuit for enabling of the operation. In the LSI according to the present invention, the authentication circuit cancels the reset signal to the debug I/F circuit for enabling of the operation. For this reason, even if authenticated, it is possible to realize by cancellation of the existent reset.

Furthermore, in the LSI according to the present invention, the authentication circuit forms an authentication key by encoding the transmission key by a predetermined key, and compares the reception signal with the authentication key. In the debugging method according to the present invention, the authentication step has a step of forming the authentication key by encoding that encode the transmission key by the predetermined key, and of collating the reception signal with the authentication key. As encoded, the higher security is possible.

In the LSI according to the present invention, the authentication circuit awaits a time of the operation enabling. In the debugging method according to the present invention, the authentication step has a step of waiting a time of the operation enabling. Before and after judgment of a serial data key, a waiting time is provided after the end of agreement judgment by use of a timer. For this reason, even if the third person inputs any cryptographic key data, it takes much time to obtain authentication results (reset). This causes to prevent the use of the spurious debug I/F by the third person, and furthermore when retrying several times, it takes enormous time.

In the LSI according to the present invention, the authentication circuit forms the transmission key with random numbers, whereby each time serial data (transmission key) to be transmitted are activated, the random numbers are based, so that the serial data are set as transmission and reception data different every time, rendering the analysis thereof difficult.

DESCRIPTION OF THE PREFERRED EMBODIMENTS

The preferred embodiments of the present invention will now be described by sorting it into a LSI, an electronic device, and other embodiments.

[LSI]

Figure 1:
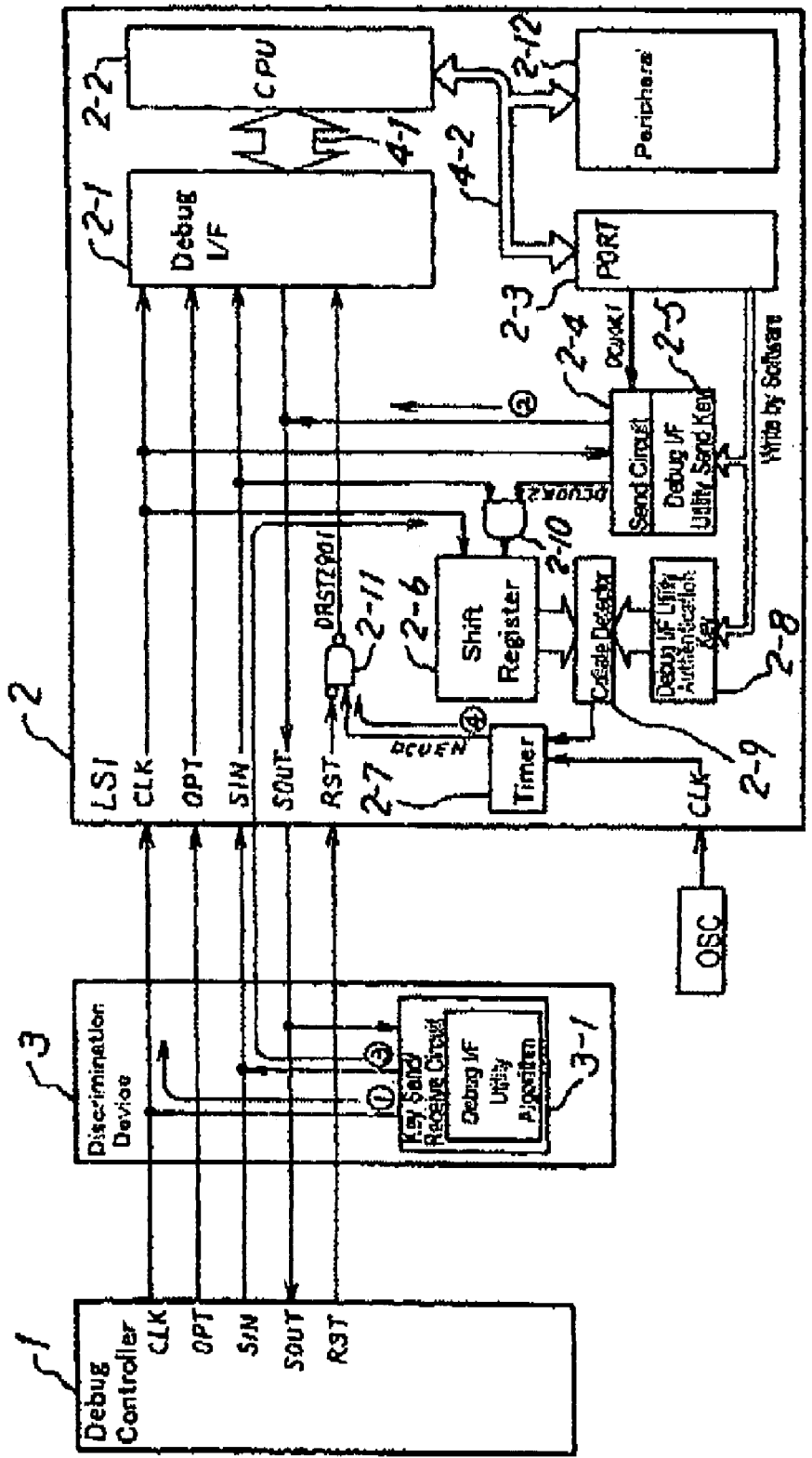
FIG. 1 is a block diagram of an LSI according to an embodiment of the present invention.
Figure 2:
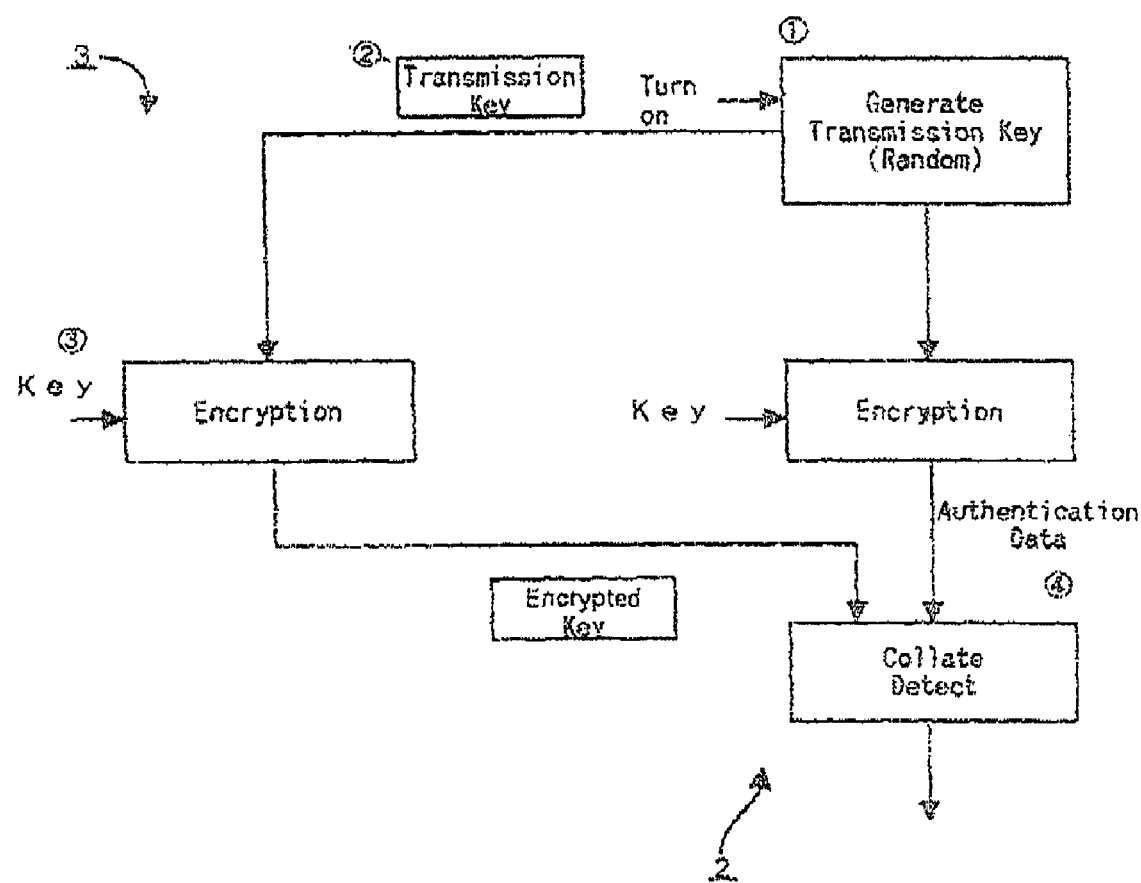
FIG. 2 is an explanatory diagram of an authentication processing of FIG. 1.
Figure 3:
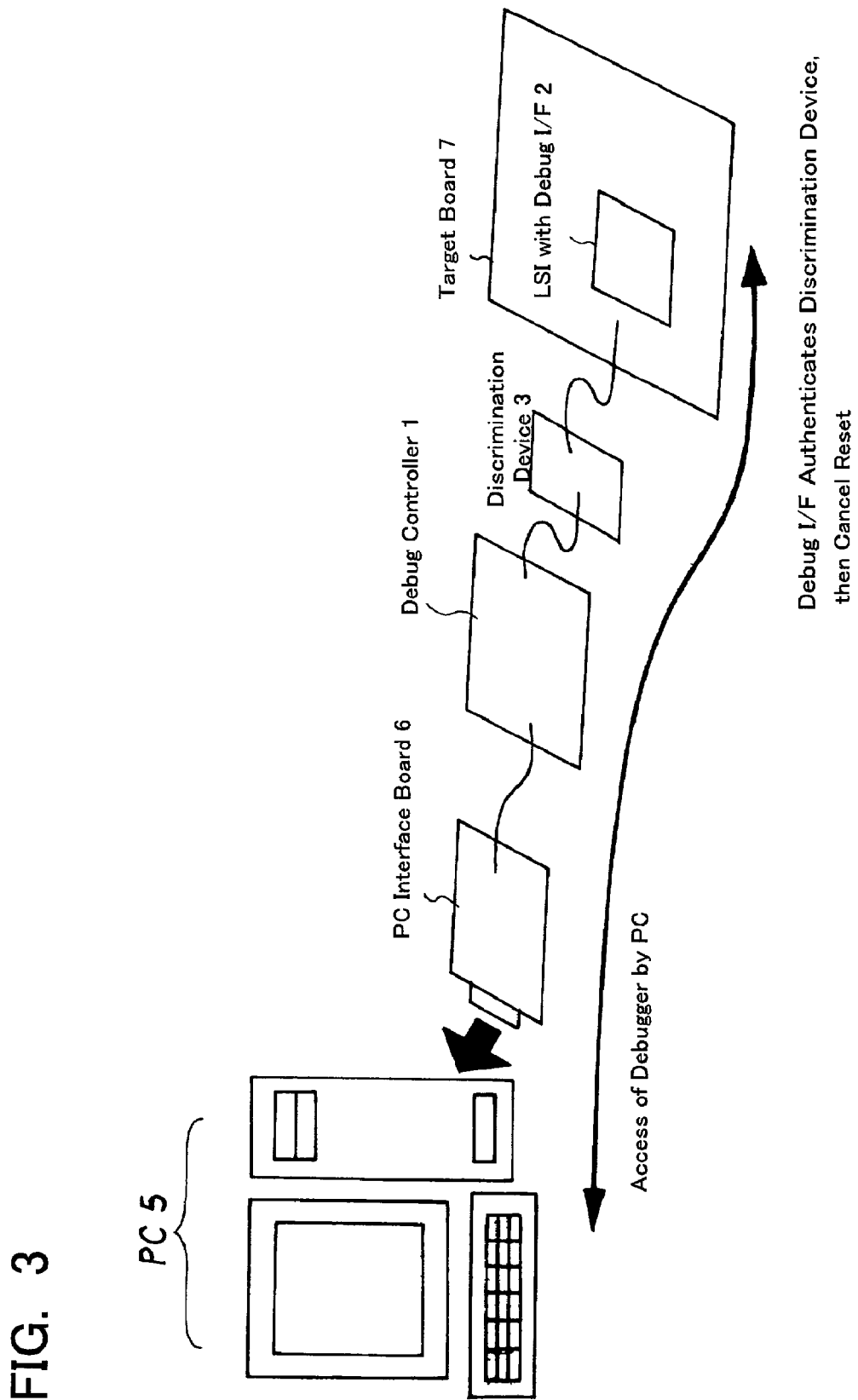
FIG. 3 is an explanatory diagram of a debugging method of the LSI of FIG. 1.
Figure 4:
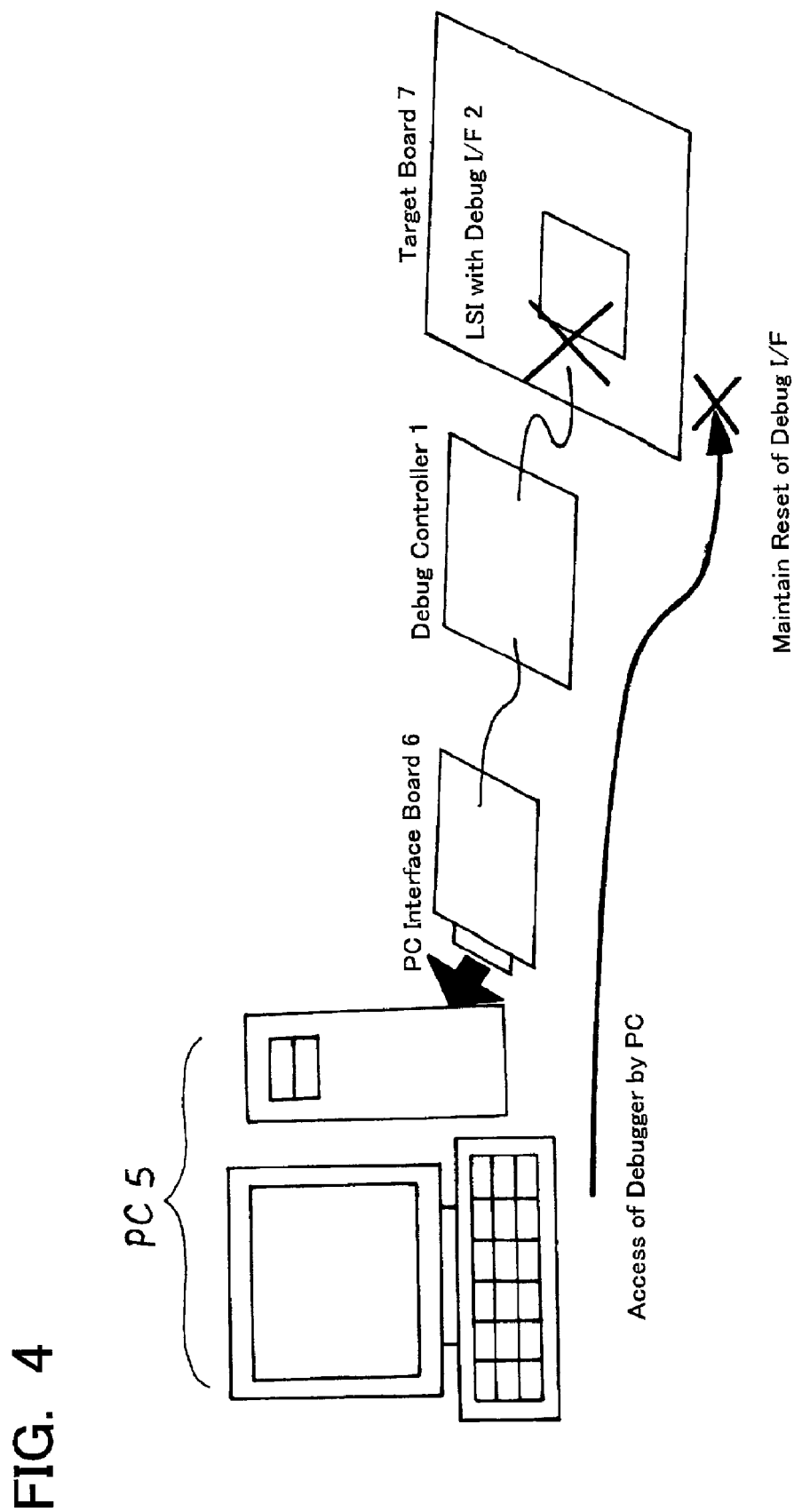
FIG. 4 is an explanatory diagram of preventing a spurious access to the LSI of FIG. 1.

FIG. 1 is a block diagram of an LSI and a debug mechanism according to a first embodiment of the present invention, and FIG. 2 is an explanatory diagram of the authentication processing, and FIG. 3 is a diagram for explaining operation at the time of a due use, and FIG. 4 is a diagram for explaining operation at the time of a spurious use.

In FIG. 1, reference numeral 2 denotes a system LSI with a CPU, and a debug I/F utilization authentication circuit according to the present invention is provided to the LSI 2. Reference numeral 1 denotes an external debug controller for utilizing the debug I/F inside the LSI 2. Reference numeral 3 denotes a discrimination device, which is used by interposing it between the LSI 2 and the debug controller 1, so as to interlock with the authentication circuit inside the LSI 2 and authenticate.

The LSI 2 has a debug I/F circuit 2-1, a CPU 2-2, a debug bus 4-1 for connecting an I/F circuit 2-1 and the CPU 2-2, and a peripheral circuit 2-12 connected to a CPU bus 4-2. The peripheral circuit 2-12 is different according to the use of the LSI, for example, an electronic money funds transferring circuit that will be explained in FIG. 6 on.

In the embodiment of the present invention, the authentication circuit is provided in this CPU bus 4-2. A structure of the authentication circuit is explained.

A port 2-3 receives write data of the CPU 2-2 from the CPU bus 4-2. A register 2-5 stores a debug I/F utilization transmission key formed by the CPU 2-2. A register 2-5 stores 10 an authentication key formed by the CPU 2-2. A transmission circuit 2-4 transmits the transmission key of the register 2-5 in synchronism with a clock supplied by the discrimination device 3. A shift register 2-6 receives a cryptographic key returned from the discrimination device 3.

An agreement detection circuit 2-9 compares a cryptographic key of the shift register 2-6 with an authentication key of a register 2-8, and detects an agreement. A timer circuit 2-7 starts counting clocks in response to an agreement detection output of the agreement detection circuit 2-9, and forms a signal for canceling a reset signal to the internal debug I/F circuit 2-1 after a constant time. A reset gate 2-11 cancels an input to the debug I/F circuit 2-1 of the reset signal according to a reset cancellation signal. A reception-enabling gate 2-10 enables the shift register 2-6 which fetches in data from a signal input terminal SIN in response to a reception-enabling signal from a transmission circuit 2-4.

Next, the discrimination device 3 is provided with a key reception circuit 3-1. When the discrimination 3 is turned on, the key reception circuit 3-1 transmits clocks and receives the aforesaid transmission key, and encodes it by a key determined previously and transmits the cryptographic key.

Next, an operational procedure capable of utilizing the debug I/F will be explained with reference to FIGS. 1 and 2. As shown in FIG. 1, the debug controller 1 utilizing the debug I/F is connected to the LSI 2 via the discrimination device 3.

① First, the LSI 2 and discrimination device 3 are turned on and activated. Then, a clock is supplied from the discrimination device 3 to the debug I/F 2-1 of the LSI 2.

Concurrently, the CPU 2-2 is activated in the LSI 2, and the LSI 2 forms the debug I/F utilizing transmission key and authentication key by a firmware, and writes them into the registers 2-5, 2-8 via the bus 4-2 and port 2-3. At this time, the transmission key is formed based on a random number, and then the authentication key is generated by encoding the transmission key by a predetermined key.

② When the key is written, the transmission circuit 2-4 transmits the transmission key in synchronism with a clock supplied by the discrimination device 3.

③ The key transmission and reception circuit 3-1 in the discrimination device 3 receives the transmission key, and encodes the transmission key by the key determined previously, and transmits the cryptographic (encoded) key. The predetermined key at this time is same as the key used a little while ago by the firmware in the LSI 2.

④ In the LSI 2, the shift register 2-6 receives the returned the cryptographic key, and the agreement detection 5 circuit 2-9 compares it with the authentication key of the register 2-8, and only in the case where agreed, the agreement detection circuit 2-9 transmits the agreement detection to the, timer circuit 2-7. The timer circuit 2-7 waits for a constant time, and cancels a reset signal to the internal debug I/F 2-1 by the gate 2-11.

Thus, for the first time, the debug I/F circuit 2-1 of the LSI 2 can be utilized. Namely, the reset signal is transmitted from the debug controller 1 to the LSI 2, and resets the debug I/F circuit 2-1, and utilizes the debug I/F circuit 2-1, and can access the CPU 2-2.

As shown in FIG. 3, a LSI provider offers the LSI 2 and discrimination device 3 to a developer for an apparatus. The encryption key of the LSI 2 is same with the encryption key of the discrimination device 3. The developer mounts the LSI 2 on the target board 7, and develops the device.

In the case where the debug is performed, the LSI 2 is connected to the discrimination device 3, which is connected to the debug controller 1, the PC interface board 6, and the personal computer 5. When the discrimination device 3 intervenes therebetween, the above authentication sequence works to cancel a reset, so that the debugger on the PC 5 can utilize the debug I/F circuit 2-1. Furthermore, even after the device is shipped to a field, the discrimination device 3 is connected, thereby utilizing the debugger on the PC 5.

On the other hand, as shown in FIG. 4, in the case where the discrimination device 3 is not connected, the reset is not canceled in the debug I/F circuit 2-1 of the LSI 2, and the debugger of the PC 5 cannot access the CPU 2-2 of the LSI 2. For example, after the device is shipped to the field, it is possible to protect the CPU 2-2 from dishonesty such as reverse engineering of internal operation of the CPU 2-2 by utilizing the debug I/F of the third person, and to hold the higher security than the conventional device.

Namely, in a security technique such as a conventional password authentication, etc., if the password is leaked, the security function is not performed, and the password is easy to elucidate by retrying. Accordingly, the security technique is unfit as a security mechanism of the LSI 2 to be presented to a great number of users. According to this embodiment, since in order to realize the security with a set of the discrimination device 3 and LSI 2, the security is carried out by the physical connection and authentication algorithm, the high security is enabled. Furthermore, the spurious engineering by the PC 5 is difficult.

Furthermore, in some cases, since the aforesaid utilization authentication function is an encryption algorithm, a skillful spurious person knows existence of the authentication mechanism and tries the engineering by retrying the encryption key (data). According to this embodiment, since this engineering becomes difficult, the next technique is adopted.

First, after the serial data key is judged, waiting time is provided after end of the agreement judgment by use of the timer 2-7. For this reason, even if the third person inputs any cryptographic key data by connection of FIG. 4, it takes much time until obtaining authentication results (reset). Thus, the spurious debug I/F utilization by the third person is prevented, and it takes enormous time when retrying several times.

Second, each time the serial data (transmission key) to be transmitted are activated, the random numbers are based, so that the engineering becomes difficult as set as transmission and reception data different each time.

Third, the reception operation of the shift register is conducted for a constant time after the transmission key is transmitted, and only one time reception is made at the time of one time activation, and since if data are repeatedly input, not accepted, the engineering is difficult.

Figure 5:
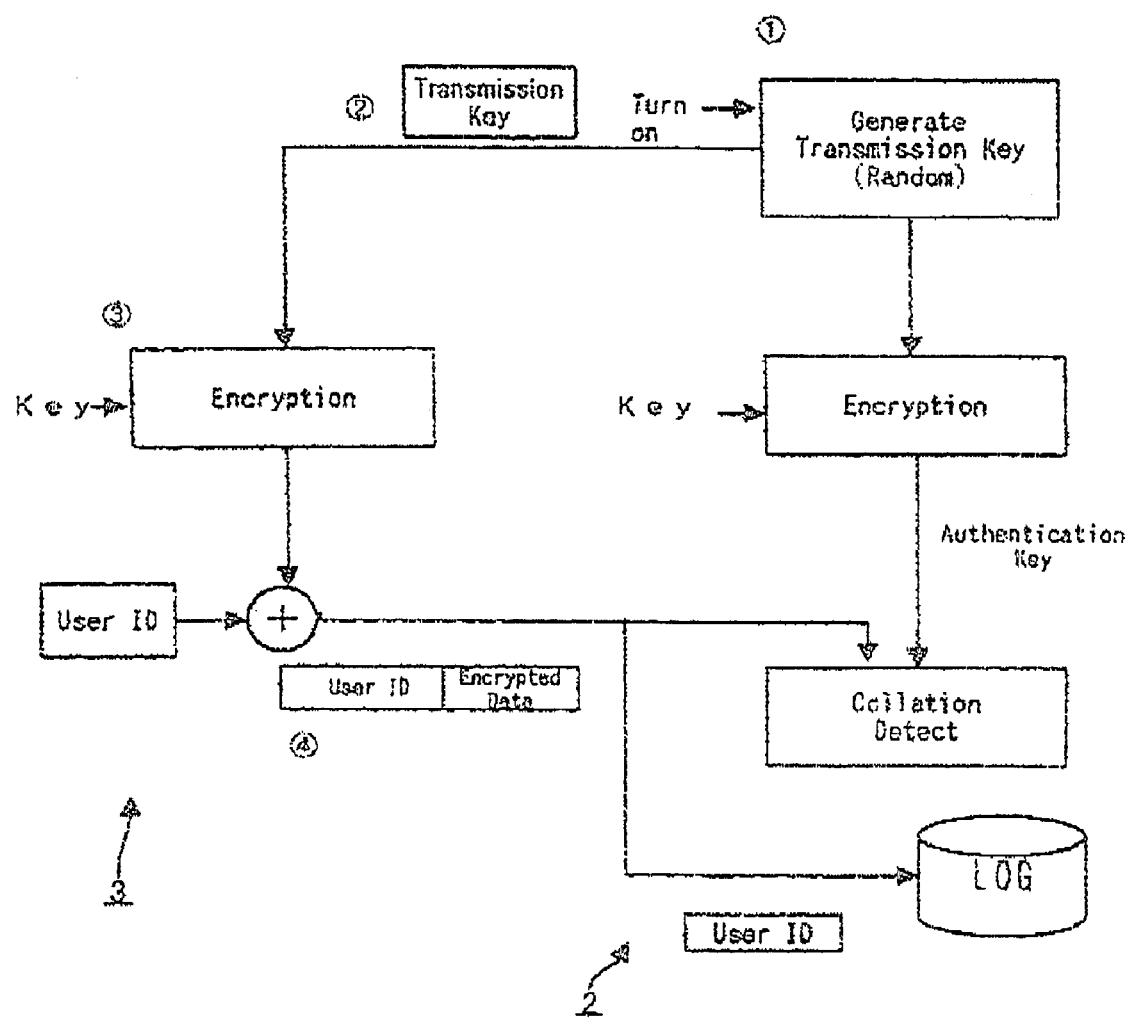
FIG. 5 is an explanatory processing of another authentication processing of FIG. 1.

Next, in FIG. 5, the authentication processing according to another embodiment of the present invention will be explained.

① First of all, when the LSI 2 and discrimination device 3 are turned on, a clock is supplied from the discrimination device 3 to the debug I/F 2-1 of the LSI 2. Concurrently, in the LSI 2, the CPU 2-2 is activated to form the debug I/F utilization transmission key and authentication key by the firmware, as described above, to write them into the registers 2-5, 2-8 via the bus 4-2 and the port 2-3.

② When the key is written, in synchronism with the clock supplied by the discrimination device 3, the transmission circuit 2-4 transmits the transmission key.

③ The key transmission and reception circuit 3 in the discrimination device 3 receives the transmission key, and encodes the transmission key by the key determined previously, and transmits the cryptographic (encoded) key. The predetermined key at this time is same with the key used a little while ago by the firmware in the LSI 2. The discrimination 3 annexes a user ID and transmits it to the LSI 2.

④ In the LSI 2, the shift register 2-6 receives the returned cryptographic key, and the agreement detection circuit 2-9 compares it with the authentication key of the register 2-8, and only in the case where agreed, the agreement detection circuit 2-9 transmits the agreement detection to the timer circuit 2-7. After the timer circuit 2-7 waits for a constant time, the timer circuit 2-7 cancels an input of the reset signal to the internal debug I/F 2-1 of the gate 2-11. Furthermore, the user ID is logged. For this reason, if information of the transmission key should be leaked, it is possible to specify which user has leaked, from the logged user IDs.

According to the embodiment of the present invention, the discrimination device 3 adopts a method of encoding the received transmission key and user ID by the a predetermined key, thereby preventing the user ID is from being readily changed.

[Electronic Devices]

Figure 6:
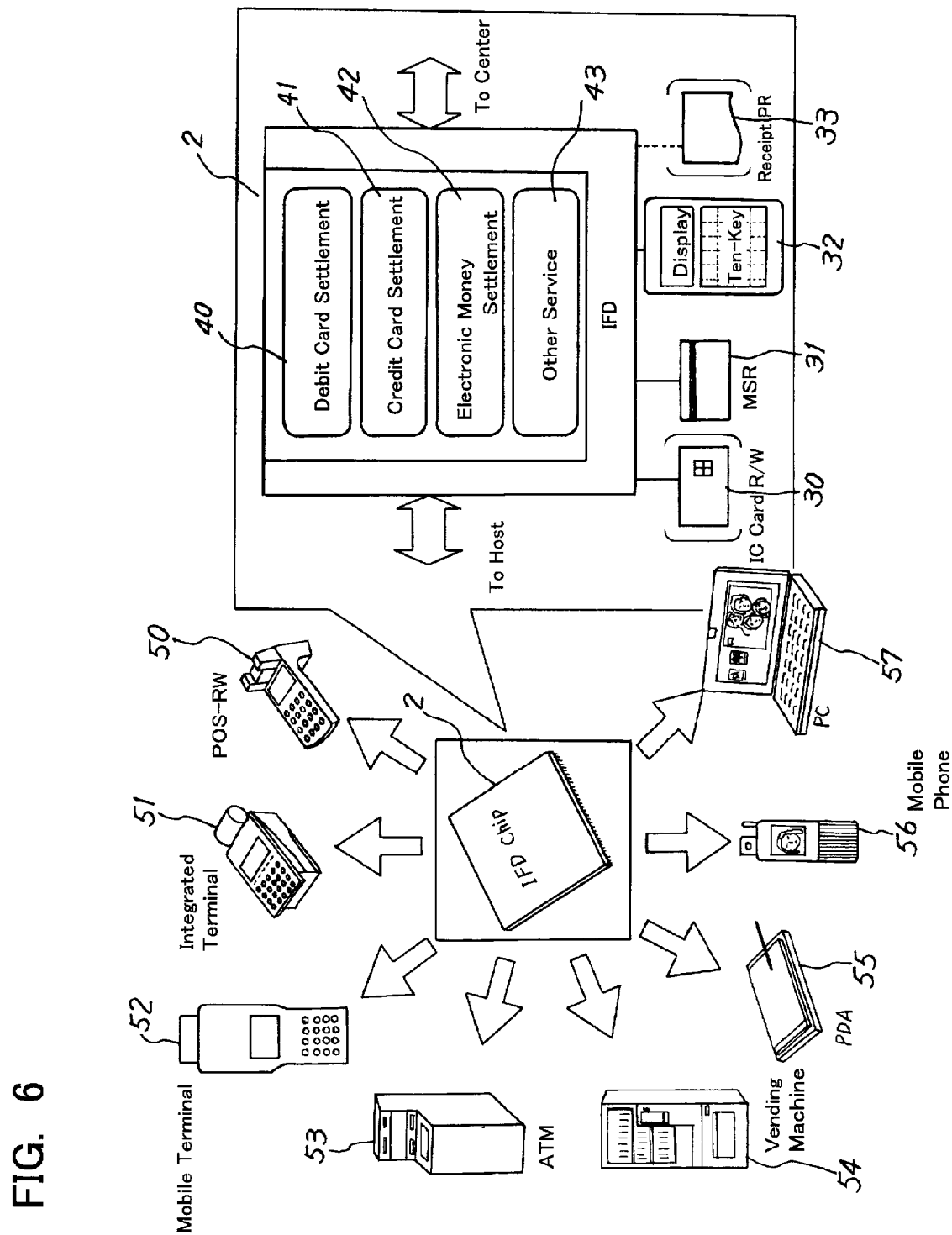
FIG. 6 is an explanatory diagram of an electronic device mounting the LSI of FIG. 1.
Figure 7:
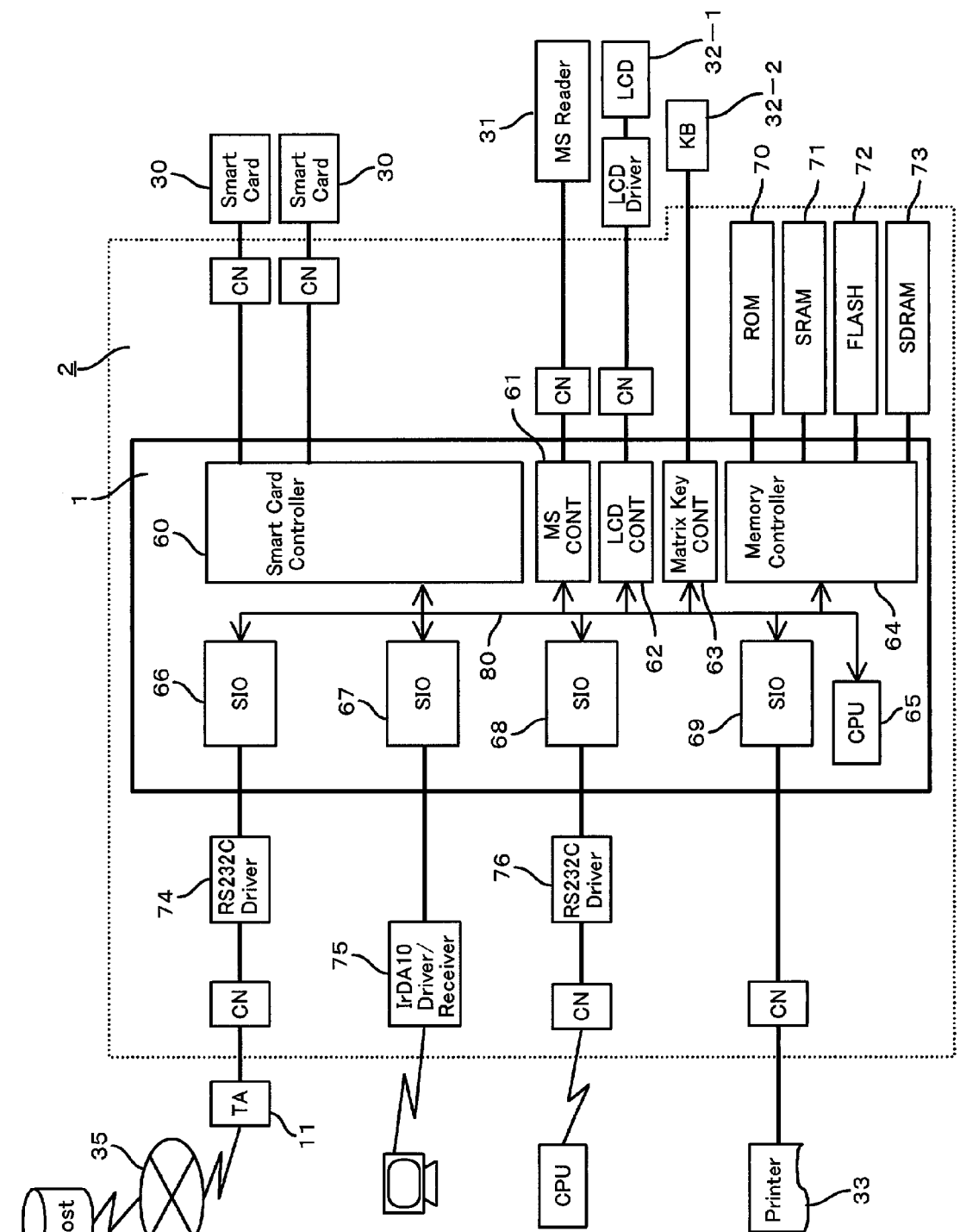
FIG. 7 is a block diagram of a peripheral circuit of FIG. 1.
Figure 8:
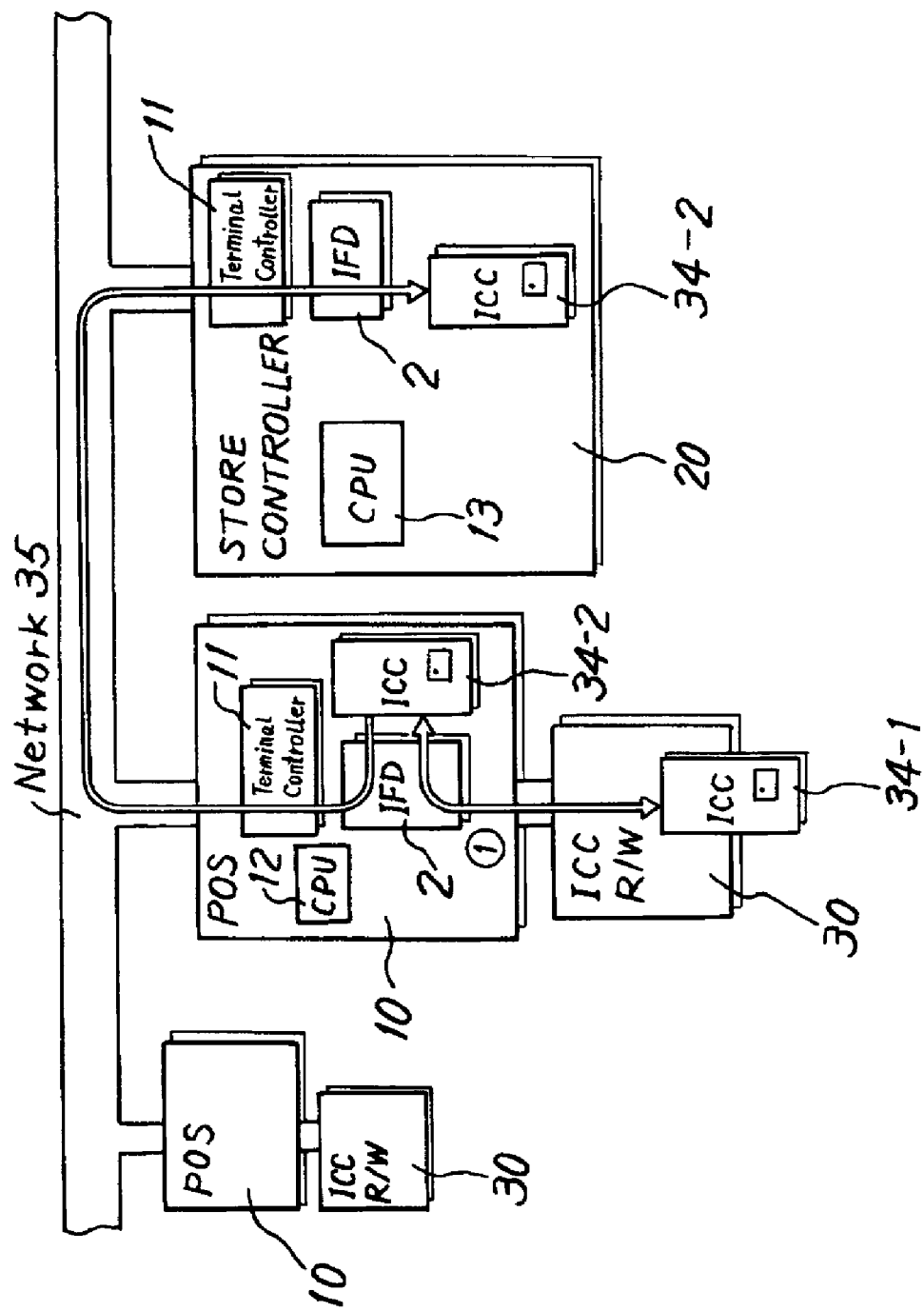
FIG. 8 is a configuration diagram of a POS system mounting the LSI of FIG. 6.
Figure 9:
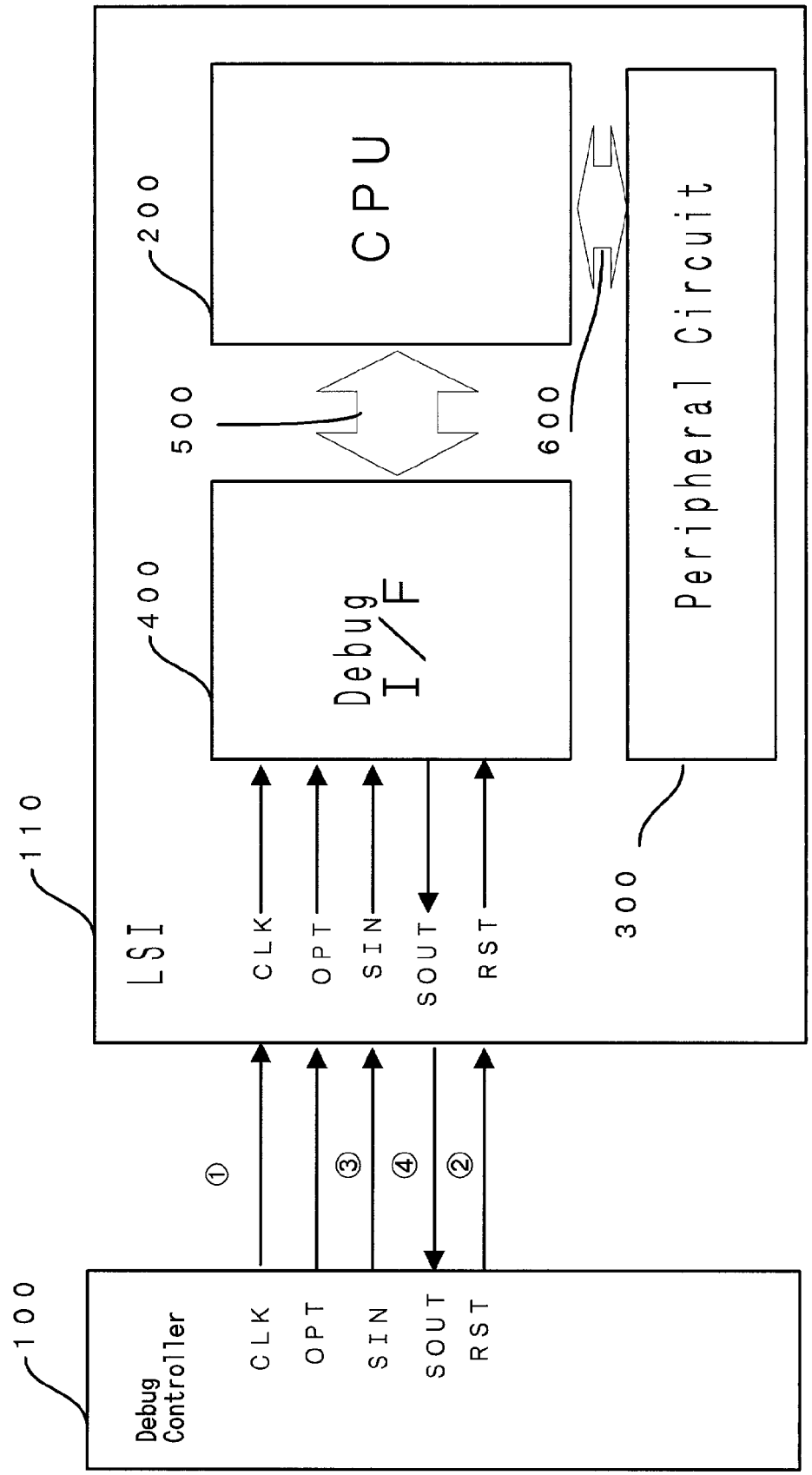
FIG. 9 is an explanatory diagram of the prior art.

Next, electronic devices mounting the aforesaid system LSI 2 will be explained. FIG. 6 is an explanatory diagram of an example to which the system LSI 2 is applied, and FIG. 7 is a structural diagram of a peripheral circuit of the LSI 2 in this application example, and FIG. 8 is an explanatory diagram of the electronic devices.

As shown in FIG. 6, the system LSI 2 is a card funds transferring LSI, and has a debit card funds transfer function 40, a credit card funds transfer function 41, an electronic money funds transfer function 42, and other service functions 43. For this reason, the LSI 2 is connected to an IC card reader/writer 30, a magnetic card reader 31, and a display and ten-key pad 32. Furthermore, as occasion arises, the LSI 2 is connected to a receipt printer 33. These funds transfer functions 40 to 43 are realized by execution of the programs of the CPU 2-2 of the LST 2.

Accordingly, by mounting this LSI 2, a card funds transfer function is imparted to various electronic devices 50 to 57. These electronic devices are, for example, a POS (point of sales) reader/writer 50, an integrated terminal 51, a mobile terminal 52, an ATM (automatic teller machine) 53, an automatic vending machine 54, a PDA (personal digital assistant) 55, a portable telephone 56, and a PC (personal computer) 57.

The peripheral circuit 2-12 of the LSI 2 for the card funds transfer will he explained with reference to FIG. 7. The peripheral circuit 2-12 has a smart card controller 60, a MS (Magnetic stripe) control circuit 61, a LCD control circuit 62, a matrix KB control circuit 63, a memory controller 64, and serial I/O ports 66 to 69. In FIG. 7, the above LSI 2 indicates a condition of being mounted on the target board 7, and for clarity of description of the LSI 2, only the CPU 2-2 65 and peripheral circuit 2-12 (60-64, 66-69) are shown. Of course, the LSI 2 includes the debug I/F and the authentication circuit.

The smart card controller 60 reads/writes data of the IC card (called a smart card) via the IC card reader/writer 30. The MS control circuit controls the MS (magnetic stripe) reader 31. The LCD control circuit 62 controls a display of the LCD (liquid crystal display) 32-1. The matrix KB control circuit 63 recognizes an input of a ten-key pad 32-2. The memory controller 64 control an input/output into/from various memories (a ROM 65 70, a SRAM 71, a FLASH 72, a SDRAM 73) on the board 7. The serial ports 66 to 68 are connected to drivers 73 to 75 of the board 7 for inputting and outputting the serial data. These are each connected to the CPU bus 4-2.

FIG. 8 is a system configuration diagram of the electronic device mounting a funds transferring LSI, showing a POS (point of sales) system. The network 35 is connected to a store controller 20 and a plurality of POS terminals 10. The POS terminals 10 are connected to the IC card reader/writer 30. The store controller 20 and the plurality of POS terminals 10 are provided with the above funds transferring LSIs (called an IFD), which exchanges directly funds transfer data.

An IC card 34-1 for customers exchanges messages with a POS IC card 34-2 via the POS IFD 2, and the POS IC card 34-2 exchanges messages with the IC card 34-2 of the store controller 20 via an IFD 2 of the store controller 20, a terminal controller 11 of the store controller 20, a network 35, the POS terminal controller 11, and the POS IFD 2.

For example, in the case where the electronic funds transfer is carried out by the IC card, a customer's data of the IC card 34-1 are stored in the POS IC card 34-2 via the POS IFD 2. Thereafter, the stored data of the POS IC card 34-2 are stored in the IC card 34-2 of the store controller 20 via the IFD 2 of the store controller 20, the terminal controller 11 of the store controller 20, the network 35, the POS terminal controller 11, and the POS IFD 2.

In this system, as a route of the electronic funds transfer data is closed by the IFD 2, there is no fear that funds transfer data (a password, an accounting number, a balance, and the like) are leaked. Therefore, safety is high.

However, as described above, if accessing the CPU 2-2 by utilizing the debug I/F, it is possible to make a spurious acquisition of funds transfer data (a password, an accounting number, a balance, and the like), so that there is a fear of abusing. Accordingly, an authentication mechanism according to the present invention is, in particular, valid for such uses.

[Other Embodiments]

In addition to the aforesaid embodiments, the following modifications according to the present invention are possible:

(1) According to the aforesaid embodiments, the reset signal is canceled by the authentication, but a gate may be provided at a clock input side of the debug I/F 2-1, so that a clock input is enabled by the authentication.

(2) According to the aforesaid embodiments, the waiting time are provided by the timer after the agreement judgment, but the waiting time may be performed for the judgment by the timer before the agreement judgment.

(3) In the case where the disagreement is detected by the agreement judgment, this can be notified to the peripheral circuit. Thus, the peripheral circuit judges as a spurious access, and for example, it is possible to make a disposition such as erasing of data required for the security.

(4) The system LSI is explained for the card funds transfer, but it may be used as the other applications.

(5) The explanation is made as the debug I/F of the CPU, but the present invention can be applied to the debug I/F of the other circuits.

Although the present invention has been described in light of the preferred embodiments thereof, the present invention could be variously modified without departing from the sprit of the present invention, and those modifications are not to be excluded from the scope of the invention.

As set forth hereinabove, according to the present invention, the following effects are presented.

Since the authentication circuit is provided between the debug I/F circuit and the debug terminal, it is possible to protect the internal circuit from dishonesty such as the reverse engineering, etc. of operation of the internal circuit by utilizing the debug I/F of the third person, and to hold the security higher than the conventional device.

Furthermore, since the security is carried out by the physical connection and authentication algorithm with a set of the discrimination device 3 and LSI 2, therefore, the high security is enabled. Furthermore, the spurious engineering by the PC 5 is difficult.

What is claimed is:

1. An IC comprising:
an internal circuit;
a debug I/F circuit for debugging the internal circuit externally; and
an authentication circuit which is provided between the debug I/F circuit and a debug terminal for connecting outside, and for transmitting a transmission key from the debug terminal to outside, and authenticating from a reception signal received from the debug terminal and said transmission key to enable operation of the debug I/F circuit,
wherein said internal circuit comprises a CPU connected to said debug I/F circuit through a debug bus and a peripheral circuit connected to said CPU through an internal bus separated from said debug bus, wherein said CPU writes said transmission key to said authentication circuit to start transmission of the transmission key.

2. The IC according to claim 1, wherein the authentication circuit cancels a reset signal to the debug I/F circuit for enabling the operation.

3. The IC according to claim 1, wherein the authentication circuit generates an authentication key by encrypting the transmission key by a predetermined key, and collates said reception signal with the authentication key.

4. The IC according to claim 1, wherein the authentication circuit time-awaits the operation enabling after said authentication.

5. The IC according to claim 1, wherein the authentication circuit generates the transmission key by random numbers.

6. An electronic device mounted with an IC, said IC comprising:
   an internal circuit;
   a debug I/F circuit for debugging the internal circuit externally; and
   an authentication circuit which is provided between the debug I/F circuit and a debug terminal for connecting outside, and for transmitting a transmission key from the debug terminal to outside, and collating a reception signal received from the debug terminal with the transmission key to enable operation of the debug I/F circuit,
   wherein said internal circuit comprises a CPU connected to said debug I/F circuit through a debug bus and a peripheral circuit connected to said CPU through an internal bus separated from said debug bus, wherein said CPU writes said transmission key to said authentication circuit to start transmission of the transmission key.

7. The electronic device according to claim 6, wherein the authentication circuit cancels the reset signal to the debug I/F circuit for enabling the operation.

8. The electronic device according to claim 6, wherein the authentication circuit generates an authentication key by encrypting the transmission key by a predetermined key, and collates the reception signal with the authentication key.

9. The electronic device according to claim 6, wherein the authentication circuit time-awaits the operation enabling after said authentication.

10. The electronic device according to claim 6, wherein the authentication circuit forms the transmission key by random numbers.

11. A debugging method for utilizing a debug I/F circuit and debugging an internal circuit externally, comprising the steps of:
    transmitting a transmission key externally when the debug I/F circuit is activated; and
    authenticating a reception signal received externally and the transmission key to enable operation of the debug I/F circuit,
    wherein the step of authenticating further comprises connecting a CPU to said debug I/F circuit through a debug bus and connecting a peripheral circuit to said CPU through an internal bus separated from said debug bus, wherein the step of authenticating further comprises a step of starting said transmitting step by writing said transmission key to an authentication circuit with said CPU.

12. The debugging method according to claim 11, wherein the authentication step includes a step of canceling a reset signal to the debug I/F circuit for enabling the operation.

13. The debugging method according to claim 11, wherein the authentication step includes:
    a step of generating the authentication key by encrypting the transmission key by a predetermined key, and
    a step of collating the reception signal with the authentication key.

14. The debugging method according to claim 11, wherein the authentication step has a step of time-awaiting the operation enabling after said authentication.

15. The debugging method according to claim 11, wherein the transmission step has a step of forming the transmission key by random numbers.

16. The debugging method according to claim 11, further comprising:
    a step of receiving the transmission key and encrypting the transmission key by a predetermined key, and transmitting the reception signal with a discrimination device provided between a debugger and the debug I/F circuit.

17. A debugger for debugging an IC, the IC comprising an internal circuit; a debug I/F circuit for debugging the internal circuit; and an authentication circuit which is provided between the debug I/F circuit and a debug terminal, said debugger comprising:
    a debug unit for debugging said IC; and
    a discrimination device which is provided between said debug unit and said debug I/F circuit, and for receiving a transmission key from said authentication circuit, encrypting said transmission key by a predetermined key, and transmitting the encrypted transmission key to said authentication circuit to enable debugging of said IC by said debug unit,
    wherein said internal circuit comprises a CPU connected to said debug I/F circuit through a debug bus and a peripheral circuit connected to said CPU through an internal bus separated from said debug bus, wherein said CPU writes said transmission key to said authentication circuit to start transmission of the transmission key.

* * * * *